(12) United States Patent
Tsai et al.

(10) Patent No.: US 11,158,588 B2
(45) Date of Patent: Oct. 26, 2021

(54) PACKAGED SEMICONDUCTOR DEVICES, METHODS OF PACKAGING SEMICONDUCTOR DEVICES, AND POP DEVICES

(71) Applicant: Taiwan Semiconductor Manufacturing Co., Ltd., Hsinchu (TW)

(72) Inventors: Po-Hao Tsai, Zhongli (TW); Jui-Pin Hung, Hsinchu (TW); Jing-Cheng Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/901,516

(22) Filed: Jun. 15, 2020

(65) Prior Publication Data

US 2020/0312791 A1    Oct. 1, 2020

Related U.S. Application Data

(63) Continuation of application No. 16/734,889, filed on Jan. 6, 2020, which is a continuation of application (Continued)

(51) Int. Cl.
*H01L 33/00* (2010.01)
*H01L 23/00* (2006.01)
(Continued)

(52) U.S. Cl.
CPC .......... *H01L 23/562* (2013.01); *H01L 21/486* (2013.01); *H01L 21/4853* (2013.01); *H01L 21/4857* (2013.01); *H01L 21/565* (2013.01); *H01L 21/78* (2013.01); *H01L 23/3114* (2013.01); *H01L 23/49816* (2013.01); (Continued)

(58) Field of Classification Search
CPC .................................................. H01L 2924/00
See application file for complete search history.

(56) References Cited

U.S. PATENT DOCUMENTS 4,827,328 A    5/1989 Ozawa et al.
7,173,327 B2   2/2007 Siniaguine
(Continued)

FOREIGN PATENT DOCUMENTS

CN    101981655 A    2/2011
CN    102842537 A    12/2012
TW    200917393 A    4/2009

*Primary Examiner* — Thao P Le
(74) *Attorney, Agent, or Firm* — Slater Matsil, LLP

(57) ABSTRACT

A packaged semiconductor device includes a substrate and a contact pad disposed on the semiconductor substrate. The packaged semiconductor device also includes a dielectric layer disposed over the contact pad, the dielectric layer including a first opening over the contact pad, and an insulator layer disposed over the dielectric layer, the insulator layer including a second opening over the contact pad. The packaged semiconductor device also includes a molding material disposed around the substrate, the dielectric layer, and the insulator layer and a wiring over the insulator layer and extending through the second opening, the wiring being electrically coupled to the contact pad.

20 Claims, 8 Drawing Sheets

Related U.S. Application Data

No. 16/100,321, filed on Aug. 10, 2018, now Pat. No. 10,529,673, which is a continuation of application No. 15/431,486, filed on Feb. 13, 2017, now Pat. No. 10,049,989, which is a continuation of application No. 15/167,258, filed on May 27, 2016, now Pat. No. 9,570,401, which is a continuation of application No. 14/531,916, filed on Nov. 3, 2014, now Pat. No. 9,355,973, which is a continuation of application No. 13/890,162, filed on May 8, 2013, now Pat. No. 8,877,554.

(60) Provisional application No. 61/794,882, filed on Mar. 15, 2013.

(51) Int. Cl.
  *H01L 23/498* (2006.01)
  *H01L 25/10* (2006.01)
  *H01L 21/48* (2006.01)
  *H01L 23/538* (2006.01)
  *H01L 21/78* (2006.01)
  *H01L 21/56* (2006.01)
  *H01L 25/00* (2006.01)
  *H01L 23/31* (2006.01)

(52) U.S. Cl.
  CPC .... *H01L 23/49827* (2013.01); *H01L 23/5383* (2013.01); *H01L 23/5384* (2013.01); *H01L 23/5386* (2013.01); *H01L 23/5389* (2013.01); *H01L 24/03* (2013.01); *H01L 24/19* (2013.01); *H01L 24/83* (2013.01); *H01L 24/97* (2013.01); *H01L 25/105* (2013.01); *H01L 25/50* (2013.01); *H01L 23/3128* (2013.01); *H01L 24/73* (2013.01); *H01L 2224/02317* (2013.01); *H01L 2224/033* (2013.01); *H01L 2224/04105* (2013.01); *H01L 2224/12105* (2013.01); *H01L 2224/13024* (2013.01); *H01L 2224/19* (2013.01); *H01L 2224/32145* (2013.01); *H01L 2224/32225* (2013.01); *H01L 2224/73265* (2013.01); *H01L 2224/73267* (2013.01); *H01L 2224/82* (2013.01); *H01L 2224/8392* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1047* (2013.01); *H01L 2225/1058* (2013.01); *H01L 2924/01322* (2013.01); *H01L 2924/12042* (2013.01); *H01L 2924/15311* (2013.01); *H01L 2924/181* (2013.01)

(56) References Cited

U.S. PATENT DOCUMENTS

| | | | |
|---|---|---|---|
| 8,877,554 | B2 | 11/2014 | Tsai et al. |
| 9,355,973 | B2 | 5/2016 | Tsai et al. |
| 10,049,989 | B2 | 8/2018 | Tsai et al. |
| 2007/0031992 | A1 | 2/2007 | Schatz |
| 2009/0032975 | A1 | 2/2009 | Do et al. |
| 2009/0065930 | A1 | 3/2009 | Chiu |
| 2009/0140441 | A1 | 6/2009 | Camacho et al. |
| 2009/0302448 | A1 | 12/2009 | Huang |
| 2009/0325379 | A1 | 12/2009 | Hlad et al. |
| 2010/0027225 | A1 | 2/2010 | Yuda et al. |
| 2010/0035384 | A1 | 2/2010 | Eichelberger et al. |
| 2011/0024916 | A1 | 2/2011 | Marimuthu et al. |
| 2011/0049695 | A1 | 3/2011 | Shin et al. |
| 2011/0068468 | A1 | 3/2011 | Lin et al. |
| 2012/0326298 | A1 | 12/2012 | Lu et al. |
| 2013/0026618 | A1 | 1/2013 | Chen |
| 2013/0062761 | A1 | 3/2013 | Lin et al. |
| 2013/0119532 | A1 | 5/2013 | Lin et al. |
| 2013/0334712 | A1 | 12/2013 | Meyer-Berg |
| 2014/0001645 | A1 | 1/2014 | Lin et al. |
| 2014/0035127 | A1 | 2/2014 | Hirtreiter et al. |
| 2014/0063723 | A1 | 3/2014 | Ro et al. |
| 2014/0151863 | A1* | 6/2014 | Kim ............... H01L 24/13 257/672 |
| 2014/0252579 | A1* | 9/2014 | Chang ............ H01L 21/76898 257/676 |
| 2015/0235949 | A1 | 8/2015 | Yu et al. |
| 2015/0380334 | A1 | 12/2015 | Hu et al. |
| 2016/0049384 | A1 | 2/2016 | Lu et al. |
| 2016/0268224 | A1 | 9/2016 | Yang et al. |
| 2016/0307867 | A1* | 10/2016 | Jeong ............. H01L 23/4985 |
| 2017/0117222 | A1 | 4/2017 | Kim et al. |
| 2017/0154858 | A1* | 6/2017 | Tsai ............... H01L 25/105 |
| 2017/0236794 | A1* | 8/2017 | Wang ............. H01L 23/481 257/378 |
| 2019/0067104 | A1 | 2/2019 | Huang et al. |
| 2020/0144202 | A1 | 5/2020 | Tsai et al. |

\* cited by examiner

PACKAGED SEMICONDUCTOR DEVICES, METHODS OF PACKAGING SEMICONDUCTOR DEVICES, AND POP DEVICES

PRIORITY CLAIM AND CROSS-REFERENCE

This application is a continuation application and claims the benefit of U.S. patent application Ser. No. 16/734,889, filed Jan. 6, 2020, entitled "Packaged Semiconductor Devices, Methods of Packaging Semiconductor Devices, and PoP Devices," which is a continuation application and claims the benefit of U.S. patent application Ser. No. 16/100, 321, now U.S. Pat. No. 10,529,673, filed Aug. 10, 2018, entitled "Packaged Semiconductor Devices, Methods of Packaging Semiconductor Devices, and PoP Devices," which is a continuation application and claims the benefit of U.S. patent application Ser. No. 15/431,486, now U.S. Pat. No. 10,049,989, filed Feb. 13, 2017, entitled "Packaged Semiconductor Devices, Methods of Packaging Semiconductor Devices, and PoP Devices," which is a continuation application and claims the benefit of U.S. patent application Ser. No. 15/167,258, now U.S. Pat. No. 9,570,401, filed on May 27, 2016, entitled "Packaged Semiconductor Devices, Methods of Packaging Semiconductor Devices, and PoP Devices," which is a continuation application of U.S. patent application Ser. No. 14/531,916, now U.S. Pat. No. 9,355, 973, filed on Nov. 3, 2014, entitled "Packaged Semiconductor Devices, Methods of Packaging Semiconductor Devices, and PoP Devices," which is a continuation application of U.S. patent application Ser. No. 13/890,162, now U.S. Pat. No. 8,877,554, filed on May 8, 2013, entitled "Packaged Semiconductor Devices, Methods of Packaging Semiconductor Devices, and PoP Devices," which claims the benefit of U.S. Provisional Application No. 61/794,882 filed on Mar. 15, 2013, entitled, "Packaging Devices and Methods of Manufacture Thereof," which applications are incorporated herein by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, in other types of packaging, or mounted directly on circuit boards or other surfaces in end applications, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Three dimensional integrated circuits (3DICs) and package-on-package (PoP) devices are some recent packaging designs in which multiple dies are stacked vertically in a package.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments of the present disclosure comprise novel methods and structures for packaging semiconductor devices. Illustrative embodiments described herein provide novel low-cost methods of forming 3DIC through-package via (TPV) interconnect structures. The packages include a redistribution layer (RDL) that has a minimal number of insulating material layers that are thin, which provides a cost savings and decreases or eliminates warping.

Figure 1:
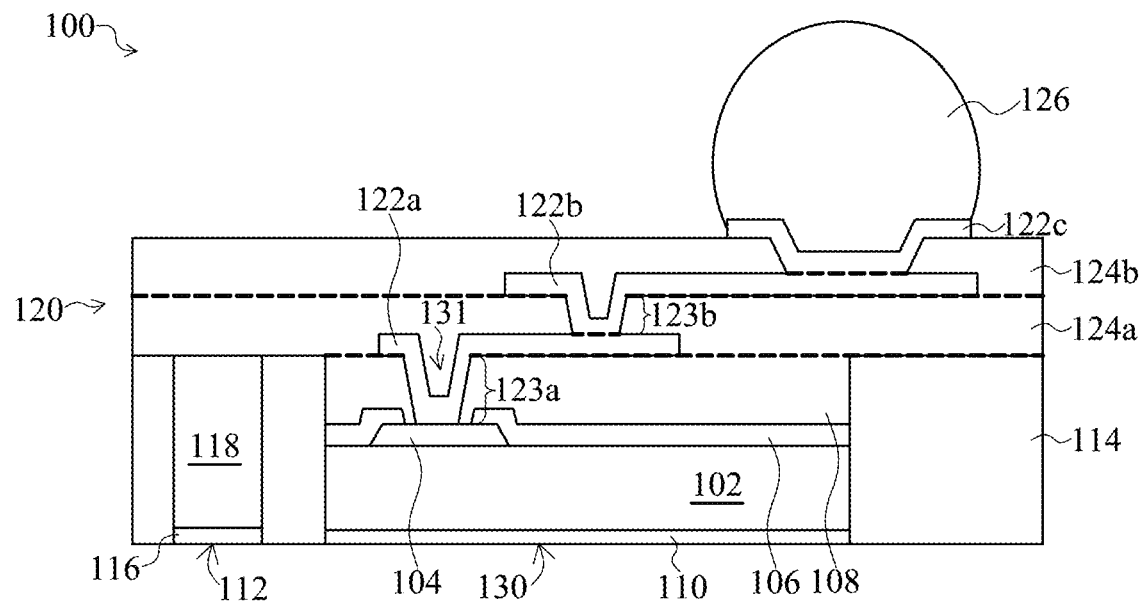
FIG. 1 shows a cross-sectional view of a portion of a packaged semiconductor device in accordance with some embodiments of the present disclosure.

FIG. 1 shows a cross-sectional view of a portion of a packaged semiconductor device 100 in accordance with some embodiments of the present disclosure. The packaged semiconductor device 100 includes a semiconductor device 130 that is packaged in accordance with embodiments of the present disclosure. A plurality of semiconductor devices 130 is first manufactured on a semiconductor wafer. The semiconductor devices 130 include contact pads 104 disposed on a surface thereof, a passivation layer 106, and a polymer layer 108, to be described further herein. The semiconductor devices 130 are singulated and then individually packaged within a molding material 114 that includes a plurality of through-package vias (TPVs) 112 formed therein that provide vertical electrical connections for the package. The packaged semiconductor device 100 includes an RDL 120 that includes wiring 122a that is coupled to the contact pads 104 of the semiconductor device 102 through openings 131 in the passivation layer 106 and polymer layer 108 and wiring 122b that is electrically coupled between wiring 122a and an under-bump metallization structure 122c which provides a mounting region for a conductive material 126. Wiring 122a is also referred to herein as a first portion 122a of the RDL 120, and wiring 122b is also referred to herein as a second portion of the RDL 120. The RDL 120 provides horizontal electrical connections for the package. Novel packaging methods for the packaged semiconductor device 100 in accordance with embodiments of the present disclosure will be described further hereon.

The semiconductor device 130 includes a substrate 102. The substrate 102 may comprise silicon, other types of bulk semiconductor material, or other materials, as examples. The substrate 102 may include one or more ICs formed thereon, not shown. The IC(s) may contain active and passive devices, conductive layers, and dielectric layers according to the electrical design of the IC(s), as examples. The substrate 102 comprises a portion of a semiconductor wafer after a plurality of ICs has been fabricated on the semiconductor wafer and singulated, for example.

A plurality of contact pads 104 are formed over the substrate 102. Only one contact pad 104 is shown in FIG. 1; however, a plurality of contact pads 104 are formed on a surface of the substrate 102 (see FIG. 2). The contact pads 104 are electrically coupled to elements or portions of wiring (not shown) within the substrate 102 and provide electrical connections to the exterior of the substrate 102. The contact pads 104 are formed from a conductive layer deposited over the substrate 102 using a deposition and patterning process. The contact pads 104 may comprise aluminum (Al), copper (Cu), tin (Sn), nickel (Ni), gold (Au), silver (Ag), other electrically conductive materials, or multiple layers or combinations thereof, as examples. The contact pads 104 may be formed using physical vapor deposition (PVD), chemical vapor deposition (CVD), an electrolytic plating process, or an electro-less plating process, as examples. The contact pads 104 may be of the same size or of different sizes.

A passivation layer 106 is formed over the surface of the substrate 102 and over the top surface of the contact pad 104 for structural support and physical isolation. The passivation layer 106 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. The passivation layer 106 has a thickness of about 0.1 μm to about 6 μm and is substantially conformal to the topography of the top surface of the substrate 102 and the contact pads 104 in some embodiments. Alternatively, the passivation layer 106 may comprise other materials and dimensions. The passivation layer 106 is not included in some embodiments.

An opening in the passivation layer 106 is made by removing a portion of passivation layer 106 using a mask-defined photoresist etching process to expose a portion of the contact pad 104, while leaving another portion of the contact pad 104 covered, in some embodiments. Openings are formed in the passivation layer 106 over each of the contact pads 104, for example. In other embodiments, openings are not formed in the passivation layer 106 over the contact pads 104. In some embodiments, openings are formed in the passivation layer 106 simultaneously with the formation of openings in a subsequently deposited polymer layer 108, to be described further herein. In embodiments wherein openings are formed in the passivation layer 106 using a lithography process before the polymer layer 108 is deposited, the openings in the passivation layer 106 may have substantially smooth sidewalls, for example.

A polymer layer 108 is formed on the passivation layer 106, following the contour of the passivation layer 106 and filling a part of the opening of the passivation layer 106 over the contact pad 104, if an opening is included in the passivation layer 106. The polymer layer 108 may be formed of a polymer, such as an epoxy, PI, BCB, PBO, and the like, although other relatively soft, often organic, dielectric materials may also be used for the polymer layer 108. Spin coating, tape laminating, or other commonly used formation methods may be used to apply the polymer layer 108. The thickness of the polymer layer 108 may be between about 5 μm and about 30 μm, for example. Alternatively, the polymer layer 108 may comprise other dimensions. The polymer layer 108 and the passivation layer 106 are referred to herein collectively as an insulating material 106/108, e.g., in some of the claims.

In accordance with some embodiments of the present disclosure, the polymer layer 108 and the passivation layer 106 are not patterned prior to singulating the semiconductor devices 130. The singulated semiconductor devices 130 are packaged by forming the TPVs 112 over a carrier (not shown in FIG. 1; see carrier 150 in FIG. 10, to be described further herein), and the semiconductor device 130 is then attached to the carrier 150 by an adhesive 110, which is shown in FIG. 1. Adhesive 110 comprises a die attach film (DAF) in some embodiments, for example.

The TPVs 112 include a seed layer 116 comprising Cu, a Cu alloy, a bi-layer of Ti/Cu, or other conductive materials, and a conductive material 118 comprising Cu, a Cu alloy, or other conductive materials plated or formed over the seed layer 116, in some embodiments. The TPVs 112 comprise a thickness or height (e.g., in a vertical direction in FIG. 1) of about 0.05 μm to about 2 μm and a width (e.g., in a horizontal direction in FIG. 1) comprising a critical dimension (CD) of the packaged semiconductor device 100, for example. The CD may comprise about 20 μm to about 300 μm in some embodiments, for example. Alternatively, the TPVs 112 and CD may comprise other materials and dimensions.

A molding material 114 is formed over the TPVs 112 and the semiconductor device 130. The molding material 114 comprises a molding compound comprised of an insulating material, such as an epoxy, a filler material, a stress release agent (SRA), an adhesion promoter, other materials, or combinations thereof, as examples. The molding material 114 is removed from over the top surface of the polymer layer 108 using a chemical-mechanical polishing (CMP) process, a grinding process, an etch process, other methods, or a combination thereof, as examples. A top portion of the TPVs 112 may also be removed in some embodiments, reducing their height or thickness.

Openings 131 are then formed in the polymer layer 108 over each of the contact pads 104. The openings 131 are also formed in the passivation layer 106 in some embodiments. In some embodiments, the openings 131 are formed in the polymer layer 108 or the polymer layer 108 and passivation layer 106 using a laser drilling process. The laser drilling process creates a jagged or rough profile, e.g., of sidewalls of the openings 131 in the polymer layer 108 or the polymer layer 108 and passivation layer 106.

The RDL 120 is then formed over the molding material 114, the TPVs 112, and the patterned polymer layer 108 or patterned polymer layer 108 and passivation layer 106. A portion of the RDL 120 is formed within the openings 131 in the polymer layer 108 or the polymer layer 108 and the passivation layer 106. Advantageously, a conductive plug is not required to be formed within the polymer layer 108 or the polymer layer 108 and passivation layer 106, which results in a time and cost savings, and further results in a fewer number of passivation, polymer, and other insulating layers for the packaged semiconductor device 100.

The RDL 120 includes a first portion 122a and a second portion 122b coupled to the first portion 122a. The first portion 122a comprises wiring that is formed over a portion of the top surface of the polymer layer 108 and within the opening 131 in the polymer layer 108 or the polymer layer 108 and passivation layer 106. The first portion 122a includes a via portion 123a that is disposed within the polymer layer 108 and passivation layer 106. The sidewalls of the via portion 123a conform to the topography of the sidewalls of the opening 131, and thus, the via portion 123a may comprise jagged or rough sidewalls due to the laser drilling process used to form the opening 131.

An insulating material 124a is formed over the first portion 122a of the RDL 120, the TPVs 112, and over exposed portions of the molding material 114 and polymer layer 108. The insulating material 124a comprises a similar material described for the polymer layer 108 in some embodiments, for example. Insulating material 124a comprises a thickness of about 1 µm to about 20 µm, for example. Alternatively, the insulating material 124a may alternatively comprise other materials and dimensions.

Insulating material 124a is patterned to form openings over portions of the first portion 122a of the RDL 120, and the second portion 122b of the RDL 120 is formed over the insulating material 124a and exposed portions of the first portion 122a of the RDL 120. The second portion 122b of the RDL 120 includes via portions 123b that extend within the openings in insulating material 124a and contact the top surface of a portion of the first portion 122a of the RDL 120. An insulating material 124b comprising similar materials and dimensions described for the insulating material 124a is formed over the second portion 122b of the RDL 120 and exposed portions of insulating material 124a. Insulating material 124b is patterned to form openings over portions of the second portion 122b of the RDL 120, and the UBM structure 122c is formed over the openings in insulating material 124b and over top portions of insulating material 124b. A portion of the UBM structure 122c contacts a top surface of a portion of the second portion 122b of the RDL 120.

The first portion 122a and second portion 122b of the RDL 120 and the UBM structure 122c comprise wiring comprised of a conductive material such as a metal having a thickness of about 2 µm to about 10 µm in some embodiments, as examples. The first portion 122a and second portion 122b of the RDL 120 and the UBM structure 122c may comprise a metal such as Ti, Al, Ni, nickel vanadium (NiV), Cu, or combinations or multiple layers thereof, as examples. The first portion 122a and second portion 122b of the RDL 120 and the UBM structure 122c may be formed using electrolytic plating, electro-less plating, sputtering, chemical vapor deposition methods, and/or photolithography processes, for example. The first portion 122a and second portion 122b of the RDL 120 and the UBM structure 122c may comprise a single layer or multiple layers. The first portion 122a and second portion 122b of the RDL 120 and the UBM structure 122c may include an adhesion layer of Ti, TiW, Cr, or other materials and/or a seed layer comprising about 0.05 µm to about 2 µm of Cu, a Cu alloy, a bi-layer of Ti/Cu, or other conductive materials, for example. Alternatively, the first portion 122a and second portion 122b of the RDL 120 and the UBM structure 122c may comprise other materials and dimensions, and may be formed using other methods.

A conductive material 126 is formed over the UBM structure 122c. The UBM structure 122c is used to electrically connect the conductive material 124 to the contact pad 104 by way of the first portion 122a and second portion 122b of the RDL 120. The conductive material 126 may have a larger diameter or diameter or width than the diameter or width of the UBM structure 122c. The conductive material 126 comprises a eutectic material and may comprise a conductive bump or a conductive ball. In some embodiments, the conductive material 126 comprises a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, SAC 405, or a solder including a minor element such as Ni or Bi with about 0.5 percent in weight (wt %), as examples. Lead-free conductive materials 126 such as solder balls may be formed from SnCu compounds as well, without the use of silver (Ag). Alternatively, lead-free solder connectors may include tin and silver, Sn—Ag, without the use of copper. The conductive material 126 may be one among an array of the conductive materials 126 formed as a grid, referred to as a "ball grid array" or "BGA". The conductive materials 126 may alternatively be arranged in other shapes.

The conductive material 126 comprises a conductive ball having a shape of a partial sphere in some embodiments. Alternatively, the conductive material 126 may comprise other shapes. The conductive material 126 may also comprise non-spherical conductive connectors, for example. The conductive material 126 is attached in some embodiments using a solder ball drop process. During the conductive material 126 mounting process, or after the conductive material mounting process, the eutectic material of the conductive material 126 may be re-flowed in some embodiments. The conductive material 126 is also referred to herein, e.g., in some of the claims, as a plurality of portions of a conductive material that are coupled to the UBM structure 122c.

The novel packaging methods described herein advantageously require a decreased number of insulating materials, such as insulating materials 124a and 124b. For example, a requirement of an additional insulating material between polymer layer 108 and insulating material 124a is avoided, because via portions 123a are formed within the polymer layer 108 rather than within an additional insulating material between polymer layer 108 and insulating material 124a. Furthermore, in some embodiments, the RDL 120 does not include the second portion 122b or insulating material 124b. The conductive material 126 can be formed within openings formed in insulating material 124a and over the top surface of a portion of insulating material 124a in some embodiments, further reducing the number of insulating materials and wiring layers of the RDL 120.

In some embodiments, polymer layer 108 comprises a polymer-1a level, insulating material 124a comprises a polymer-2 level, and insulating material 124b comprises a polymer-3 level, for example. A conductive bump is not formed within the polymer-1a level in accordance with some embodiments. Rather, the opening 131 is formed in the polymer-1a level using a laser drill, so that first portion 122a of the RDL 120 comprises a via portion 123a. The opening 131 is formed in the polymer-1a level over a contact pad 104 comprising an aluminum (Al pad) which is formed over a silicon substrate 102 in some embodiments.

The first portion 122a of the RDL 120 comprises an RDL1 level, and the second portion 122b of the RDL 120 comprises an RDL2 level, in some embodiments. The RDL1 level is formed over a portion of the polymer-1a level and lines the opening 131 in the polymer-1a level. The RDL2 level is formed over the polymer-2 level and makes electrical contact with a portion of the RDL1 level. The polymer-3 level is formed over the RDL2 level and the polymer-2 level. The polymer-3 level is patterned, and the UBM structure 122c is formed over a portion of the polymer-3 level.

Figure 2:
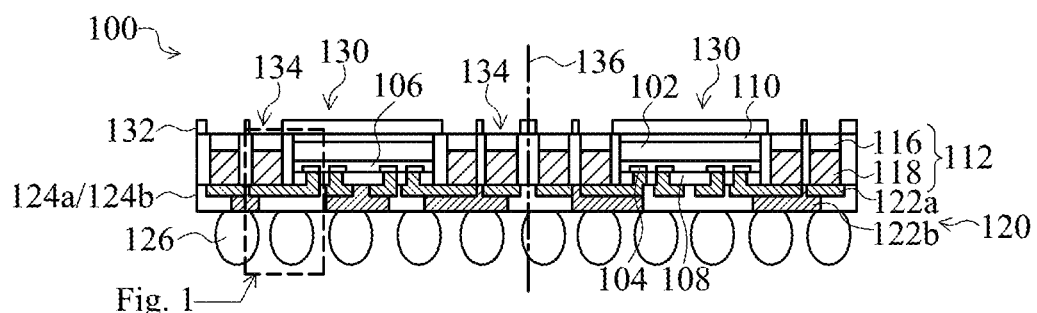
FIG. 2 illustrates a cross-sectional view of a packaged semiconductor device in accordance with some embodiments.

FIG. 2 illustrates a cross-sectional view of a packaged semiconductor device 100 in accordance with some embodiments. The view shown in FIG. 2 is inverted with respect to the view shown in FIG. 1. For example, conductive material 126 is formed over the RDL 120 on the bottom surface of the packaged semiconductor device 100. Some of the elements shown in FIG. 1 are not shown or labeled in FIG. 2, such as the UBM structure 122c. The RDL 120 includes first portions 122a and second portions 122b that are formed within polymer layer 108 and insulating materials 124a and 124b shown in FIG. 1.

Two semiconductor devices 130 are shown in FIG. 2; however, a plurality of semiconductor devices 130 (e.g., two or more semiconductor devices 130) can be packaged together in a single package in accordance with some embodiments. Alternatively, the semiconductor devices 130 can later be singulated along scribe lines 136 to form individually packaged semiconductor devices 100.

FIG. 2 also illustrates an insulating material 132 disposed on an opposite side of the semiconductor devices 130 from the RDL 120. Openings 134 are formed in the insulating material 132 in some embodiments over each of the TPVs 112, to allow electrical connections to be made to the other side of the packaged semiconductor devices 100, to be described further herein. The openings 134 can be made using a laser drill or a lithography process. Insulating material 132 is not included in the packaged semiconductor devices 100 in some embodiments. FIG. 2 also indicates a portion thereof that is shown in FIG. 1 in more detail.

Figure 3:
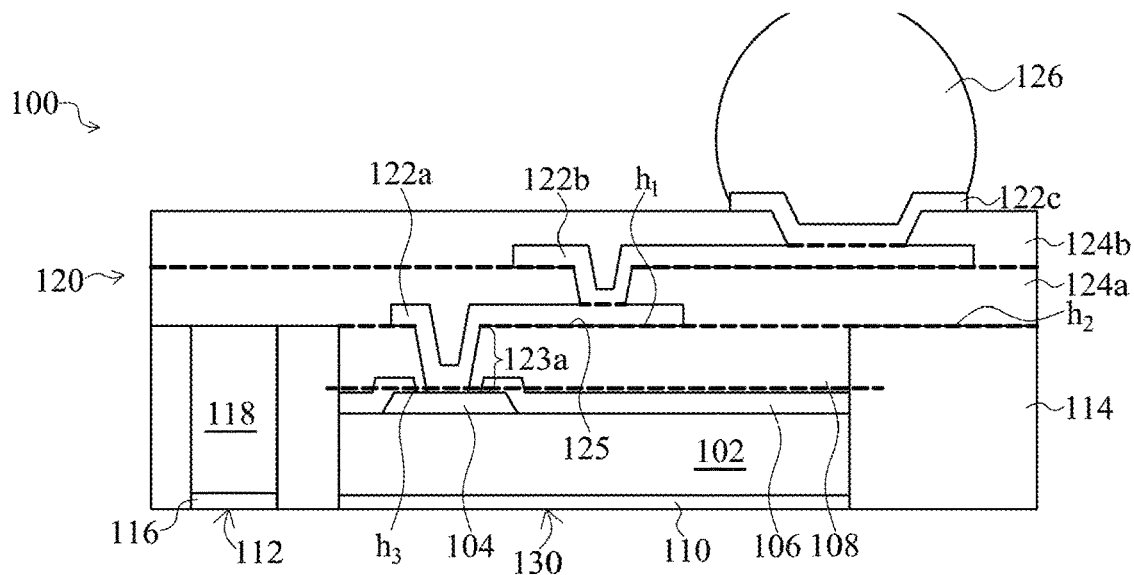
FIGS. 3, 4, and 5 show cross-sectional views of a portion of a packaged semiconductor device in accordance with some embodiments of the present disclosure.
Figure 4:
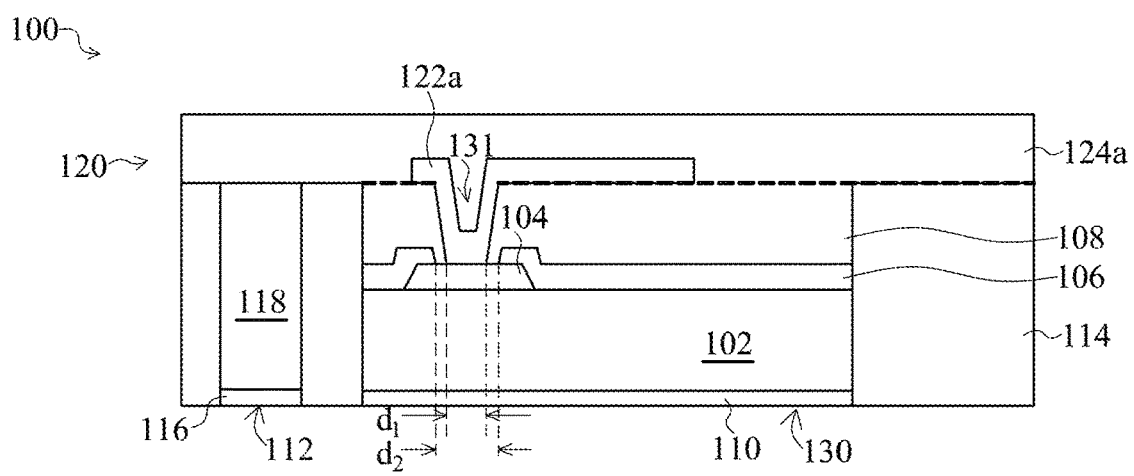
Figure 5:
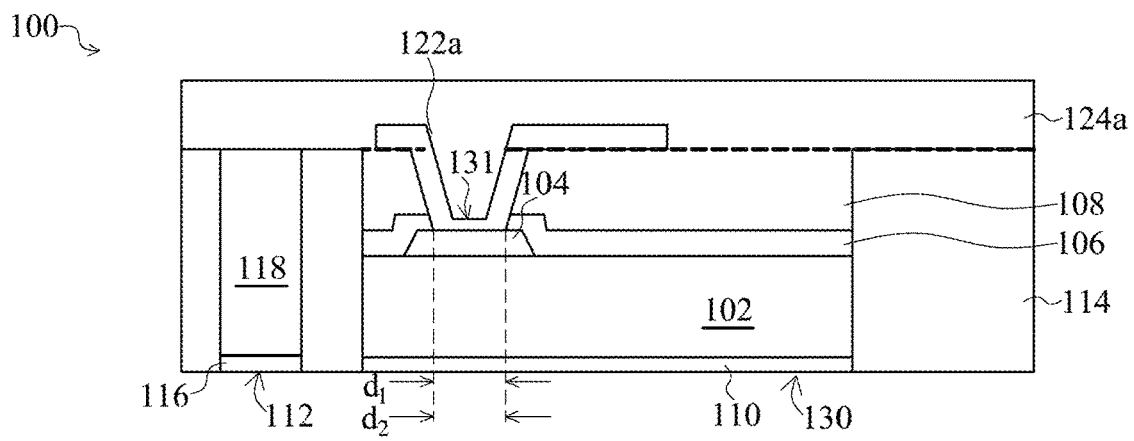

FIGS. 3, 4, and 5 show cross-sectional views of a portion of a packaged semiconductor device 100 in accordance with some embodiments of the present disclosure. FIG. 3 illustrates some heights and relative dimensions of various elements in accordance with some embodiments. The insulating material 106/108 (e.g., the polymer layer 108) comprises a top surface 125 having a first height $h_1$, and the molding material 114 comprises a top surface having a second height $h_2$. The second height $h_2$ is substantially the same as the first height $h_1$ in some embodiments. A portion of the RDL 120 (e.g., first portion 122a) comprises wiring having a bottom surface that is coupled to the top surface 125 of the insulating material 106/108 having the first height $h_1$. The first portion 122a comprises an RDL1 level with a bottom height $h_1$ that is substantially equal to the grinded molding material 114 top height $h_2$ in some embodiments, for example.

In some embodiments, the RDL 120 includes a via portion 123a (e.g., via portion 123a of the first portion 122a of the RDL 120) coupled to a top surface of the contact pad 104, also illustrated in FIG. 3. A bottom surface of the via portion 123a comprises a third height $h_3$, the third height $h_3$ being less than the second height $h_2$ of the molding material 114. The first portion 122a comprises an RDL1 level having a via portion 123a height $h_3$ that is less than the grinded molding material 114 top height $h_2$ in some embodiments, for example. The polymer layer 108 comprises a polymer-1a level has a continuous profile and critical dimension (CD) from passivation in some embodiments, for example.

FIG. 4 illustrates a cross-sectional view of some embodiments wherein the opening in the polymer layer 108 comprises a first width comprising dimension $d_1$, and the opening in the passivation layer 106 comprises a second width comprising dimension $d_2$. The second width comprising dimension $d_2$ is greater than the first width comprising dimension $d_1$ in some embodiments. Dimension $d_1$ may comprise about 5 µm to about 40 µm, and dimension $d_2$ may comprise about 15 µm to about 40 µm, as examples. Alternatively, dimensions $d_1$ and $d_2$ may comprise other values.

The opening 131 in the polymer layer 108 having a dimension $d_1$ is also referred to herein as a first opening or a top opening in the polymer layer 108, and the opening in the passivation layer 106 having dimension $d_2$ is also referred to herein as a second opening or a bottom opening in the passivation layer 106 (e.g., in some of the claims). During the manufacturing process for the semiconductor device 130, the passivation layer 106 may be patterned to form a plurality of second openings in the passivation layer 106 over the contact pads 104. Each of the plurality of second openings in the passivation layer 106 is disposed over one of the plurality of contact pads 104. Forming the plurality of first openings 131 in the polymer layer 108 comprises forming each of the plurality of first openings 131 in the polymer layer 108 within one of the second openings in the passivation layer 106, in some embodiments, resulting in dimension $d_2$ being greater than dimension $d_1$. The first openings 131 in the polymer layer 108 may be formed using laser drilling and may comprise a jagged profile or rough profile, and the larger second openings in the passivation layer 106 may be formed using lithography and may comprise a substantially smooth profile in some embodiments, for example. The polymer layer 108 comprises a polymer-1a level having a CD open on a contact pad 104 that is less than the passivation layer 106 CD open on the contact pad 104 in some embodiments, for example.

FIG. 5 illustrates some embodiments wherein each of the plurality of openings 131 in the insulating material 106/108 comprises substantially a same width within the passivation layer 106 and the polymer layer 108. Dimension $d_1$ is substantially the same as dimension $d_2$ in these embodiments, for example. The passivation layer 106 may be patterned to form second openings over the contact pads 104 before the polymer layer 108 is deposited, or alternatively, the passivation layer 106 may not be patterned. A portion of the passivation layer 106 may be removed when forming the openings 131, or alternatively, a portion of the passivation layer 106 may not be removed with forming the openings 131, for example. The first openings 131 in the polymer layer 108 and the second openings in the passivation layer 106 may both be formed using laser drilling and may comprise a jagged profile or rough profile in some embodiments, for example. The polymer layer 108 comprises a polymer-1a level having a CD open on a contact pad 104 that is substantially equal to the passivation layer 106 CD open on the contact pad 104 in some embodiments, for example.

Figure 6:
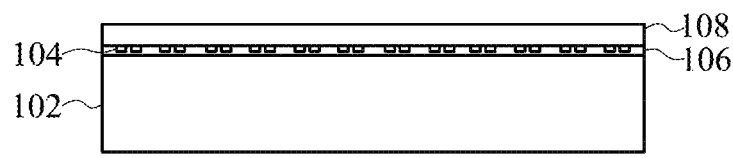
FIGS. 6 through 24 illustrate cross-sectional views of a process flow for packaging semiconductor devices at various stages in accordance with some embodiments.
Figure 7:
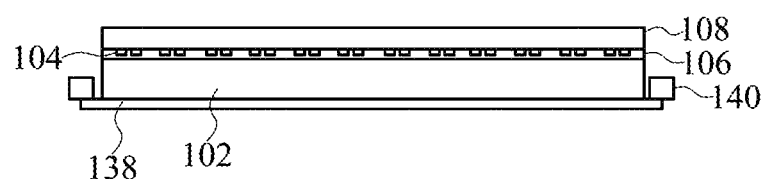
Figure 8:
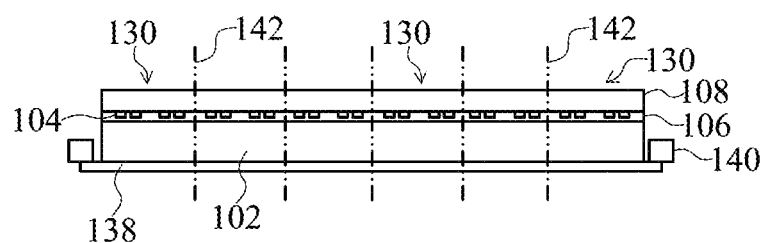
Figure 9:
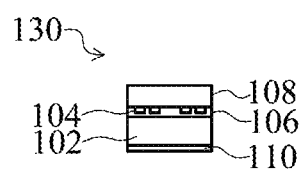

FIGS. 6 through 24 illustrate cross-sectional views of a process flow for packaging a semiconductor device 130 at various stages in accordance with some embodiments. FIGS. 6 through 9 illustrate processing steps that may be used to prepare semiconductor devices 130 for packaging. In FIG. 6, a wafer comprising a plurality of the substrates 102 shown in FIG. 1 is provided that includes contact pads 104, passivation layer 106, and polymer layer 108 formed thereon. The polymer layer 108 has a thickness of about 1 µm to about 30 µm after being applied, in some embodiments. After the polymer layer 108 is applied, the opposite side of the wafer is thinned, and the substrate 102 is attached to a tape 138 that is supported by a frame 140, or other type of carrier device, as shown in FIG. 7. The semiconductor devices 130 are singulated by sawing the substrate 102 and materials formed thereon along scribe lines 142, as shown in FIG. 8, forming individual semiconductor devices 130, as shown in FIG. 9. An adhesive 110 is applied to the thinned side of the substrate 102 before attaching the semiconductor devices 130 to a carrier 150 (see FIG. 16, to be described further herein).

Figure 10:
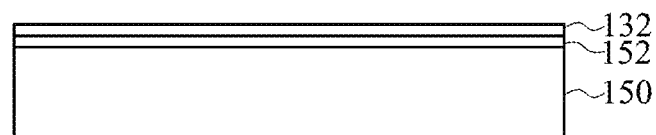

FIGS. 10 through 24 illustrate various steps of a packaging process flow for semiconductor devices 130 in accordance with some embodiments. In FIG. 10, a carrier 150 comprising a carrier wafer is provided. The carrier 150 may comprise glass, a semiconductor material, or other materials. An adhesive 152 is coupled to the carrier 150. The adhesive 152 may comprise a glue, tape, or other materials with adhesive properties. An insulating material 132 is formed over the adhesive 152. The insulating material 132 may comprise similar materials and dimensions as described for polymer layer 108, for example. In some embodiments, the insulating material 132 comprises PBO, PI, a solder resist (SR), or a combination or multiple layers thereof, for example. Alternatively, insulating material 132 may comprise other materials. Layers 152 and 132 comprise a glue/polymer base buffer layer in some embodiments, for example.

Figure 11:
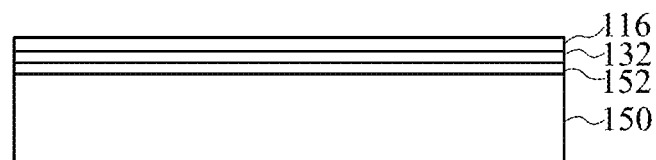

A seed layer 116 is formed over the insulating material 132, as shown in FIG. 11. The seed layer 116 may be formed by physical vapor deposition (PVD) or other methods, for example. The seed layer 116 functions as an under-bump metallization (UBM) layer in some embodiments, for example. For example, the seed layer 116 functions as a UBM layer in FIG. 25, wherein a conductive material 179 that may comprise a plurality of solder bumps or solder balls is coupled to the TPVs 112, to be described further herein.

Figure 12:
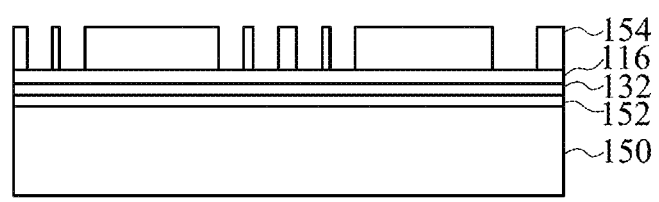
Figure 13:
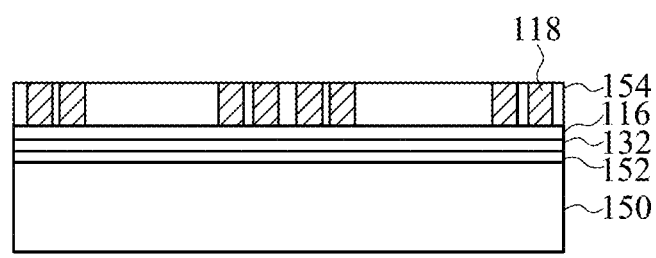
Figure 14:
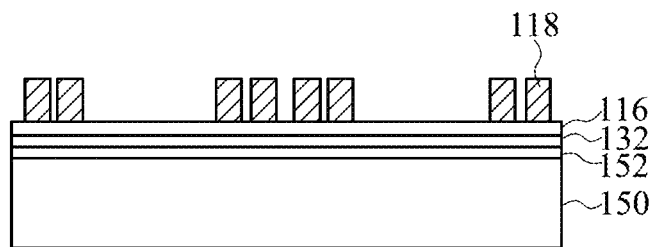
Figure 15:
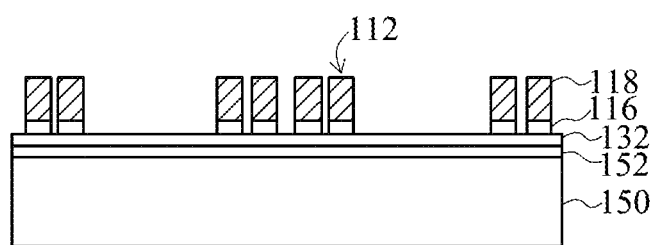

A layer of photoresist 154 is formed over the seed layer 116, as shown in FIG. 12. The layer of photoresist 154 is patterned using photolithography with a pattern for a plurality of TPVs, exposing first portions of the seed layer 116, also shown in FIG. 12. A plating process is used to form a conductive material 118 over the exposed first portions of the seed layer 116, as shown in FIG. 13. The layer of photoresist 154 is then stripped or removed, exposing second portions of the seed layer 116, as shown in FIG. 14. The exposed second portions of the seed layer 116 are then removed using an etching process or other process, as shown in FIG. 15, leaving a plurality of the TPVs 112 formed across the surface of the carrier 150. The TPVs 112 may comprise a width of about 20 µm to about 300 µm in a top view, and may comprise a circular, oval, square, rectangular, or polygon shape in the top view, as examples. Alternatively, the TPVs 112 may comprise other shapes and dimensions.

Figure 16:
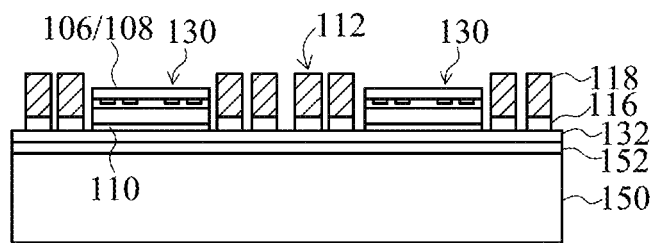
Figure 17:
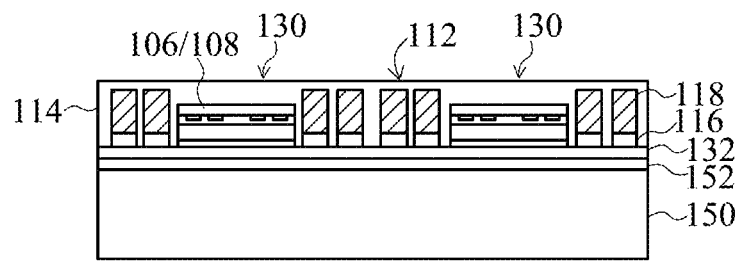
Figure 18:
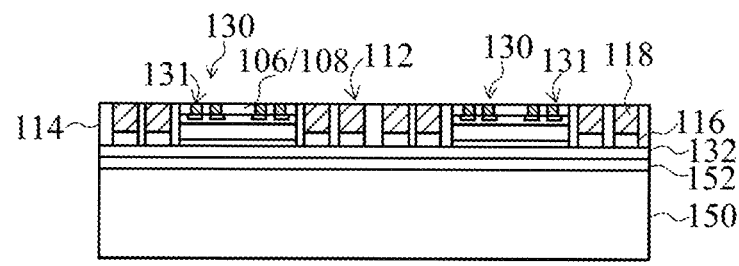

A plurality of the semiconductor devices 130 including the adhesive 110 formed thereon is placed onto the carrier 150, as shown in FIG. 16. The semiconductor devices 130 are attached to the insulating material 132 disposed over the carrier 150 manually, using a pick-and-place machine, or other methods, as examples. A molding material 114 is formed over the TPVs 112, semiconductor devices 130, and exposed portions of the insulating material 132, as shown in FIG. 17. A top surface of the molding compound 114 is removed to expose a top surface of the polymer layer 108 and a top surface of the TPVs 112, as shown in FIG. 18. Openings 131 are formed in the polymer layer 108 using a laser drilling process, also shown in FIG. 18 and as previously described for FIG. 1.

Figure 19:
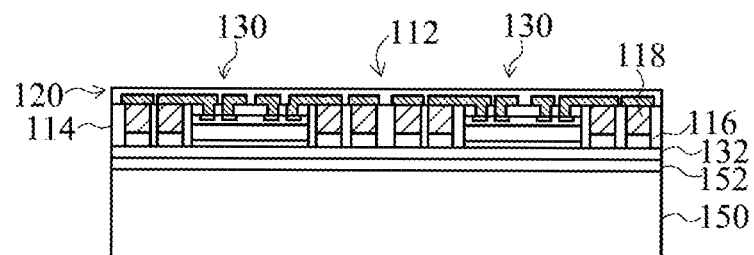
Figure 20:
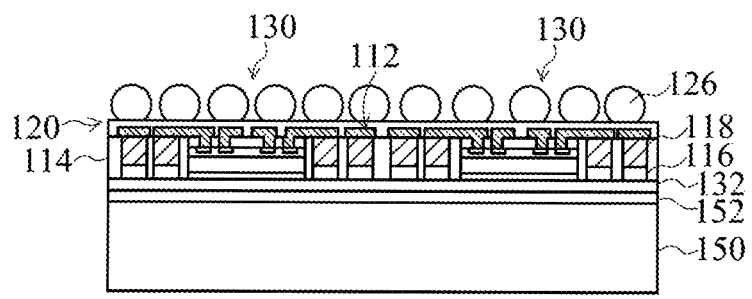

The packaging process is then continued to form the RDL 120 and form the conductive material 126 over the RDL 120, as shown in FIGS. 19 and 20 and as previously described herein. The packaged semiconductor device is electrically tested at this point in the packaging process, in some embodiments.

Figure 21:
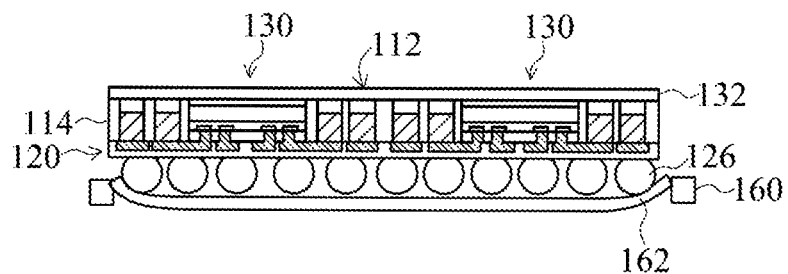
Figure 22:
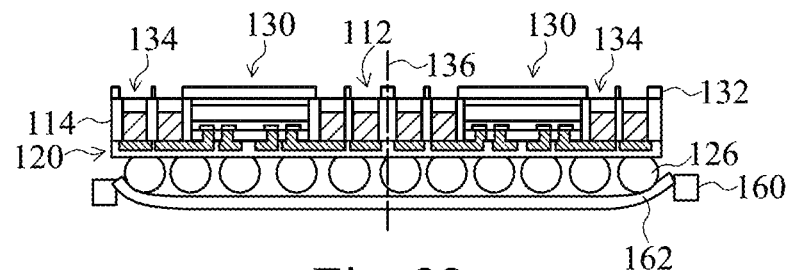

The packaged semiconductor device is debonded from the carrier 150, and the conductive material 126 is attached to a tape 162 supported by a frame 160 or other carrier, as illustrated in FIG. 21. Openings 134 are formed in insulating material 132 using a laser drilling or photolithography process, as shown in FIG. 22. Sidewalls of the openings 134 in the insulating material 132 comprise a jagged or rough profile in embodiments wherein a laser drilling process is used to form the openings 134. Sidewalls of the openings 134 in the insulating material 132 comprise a substantially smooth profile in embodiments wherein a photolithography process is used to form the openings 134. The openings 134 are formed in the insulating material 132 before singulating the plurality of semiconductor devices 130 to form packaged semiconductor devices 100 in some embodiments.

In some embodiments, the material of the TPVs 112 is then recessed (not shown). The TPVs 112 may be recessed using an etch process by about 0.1 µm to about 5 µm, for example. Alternatively, the TPVs 112 may be recessed by other amounts. In other embodiments, the TPVs 112 are not recessed.

Figure 23:
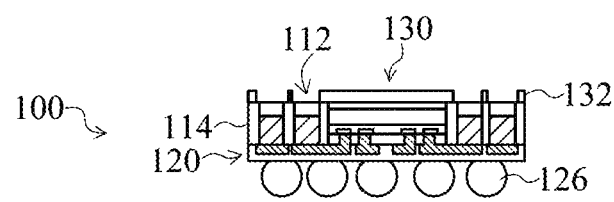
Figure 24:
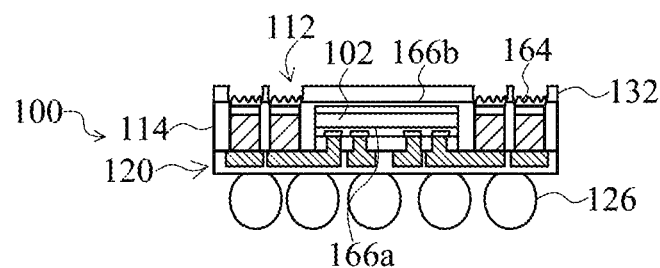

The packaged semiconductor devices are then singulated along scribe lines 136, as shown in FIG. 22, and the packaged semiconductor devices 100 are removed from the tape 162 to form individual packaged semiconductor devices 100, shown in FIG. 23. In some embodiments, a solder paste 164 is formed over a surface of each of the TPVs 112, as illustrated in FIG. 24. In other embodiments, a solder paste 164 is not applied.

In accordance with some embodiments of the present disclosure, the packaged semiconductor device 100 includes a semiconductor device 102 including an RDL 120 disposed on a first side 166a and an insulating material 132 disposed on a second side 166b, shown in FIG. 24. The TPVs 112 extend vertically through the package. The packaged semiconductor device 100 includes a novel integrated fan out (InFO) interconnect scheme.

Figure 25:
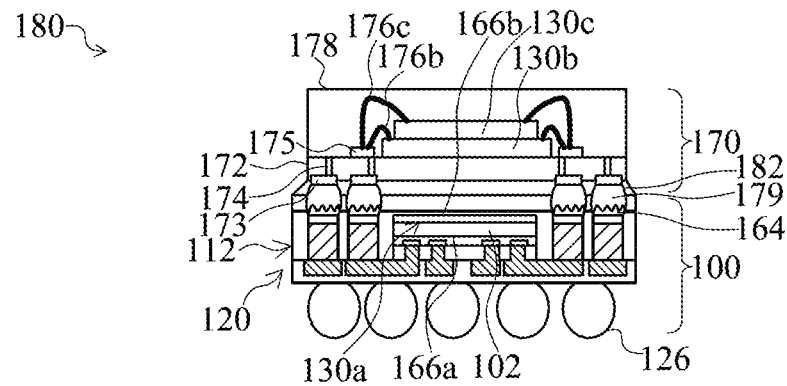
FIG. 25 is a cross-sectional view of a packaged semiconductor device described herein packaged with another packaged semiconductor device in a 3DIC configuration.

FIG. 25 is a cross-sectional view of a packaged semiconductor device 100 described herein packaged with another packaged semiconductor device 170 in a 3DIC configuration comprising a package-on-package (PoP) device 180. The packaged semiconductor device 100 is also referred to herein as a first packaged semiconductor device, and the packaged semiconductor device 170 is also referred to herein as a second packaged semiconductor device, e.g., in some of the claims.

To assemble the PoP device 180, the packaged semiconductor device 170 is provided that includes one or more semiconductor devices 130b and 130c attached to an interposer substrate 172. The packaged semiconductor device 170 is packaged with a semiconductor device 130a comprising a semiconductor device 130 shown in FIG. 1 in accordance with some embodiments. The substrate 172 of the packaged semiconductor device 170 comprises a silicon substrate, a silicon or glass interposer, a printed circuit board (PCB), an organic laminate substrate, or other type of substrate, as examples. The substrate 172 includes a plurality of through substrate vias (TSVs) 174 disposed therein. The TSVs 174 extend from a first side of the substrate 172 to a second side of the substrate 172. The TSVs 174 comprise a conductive material and provide vertical electrical connections from the first side to the second side of the substrate 172. Bond pads 175 are coupled to one or more of the TSVs 174 on the first side of the substrate 172, and contact pads 173 are coupled to one or more of the TSVs 174 on the second side of the substrate 172.

A semiconductor device 130b is coupled to the substrate 172 in a semiconductor device mounting region of the substrate 172. The semiconductor device 130b may be attached to the substrate 172 using an adhesive, tape, or other means. The semiconductor device 130b is electrically coupled to the bond pads 175 using wire bonds 176b. Semiconductor device 130c may be attached to a top surface of semiconductor device 130b using an adhesive, tape, or other means. The semiconductor device 130c is electrically coupled to the bond pads 175 using wire bonds 176c. In the figures, the semiconductor devices 130b and 130c are shown coupled to the same bond pads 175 for simplicity; however, in some embodiments, the semiconductor devices 130b and 130c are each coupled to different bond pads 175 on the substrate 172.

The packaged semiconductor device 170 may include one semiconductor device 130b in some embodiments, or the packaged semiconductor device 170 may include two or more stacked semiconductor devices 130b and 130c that may comprise different dimensions or the same dimensions. The semiconductor devices 130b and 130c may comprise one or more semiconductive material layers, one or more conductive material layers, one or more dielectric material layers, or combinations thereof, as examples. The second packaged semiconductor device 170 is coupled to an end of each of the TPVs 112 of the first packaged semiconductor device 100 by a conductive material 179 comprising a material as described for conductive material 126, in some embodiments.

In some embodiments, a molding material 178 comprising a similar material as described for molding material 114 is formed over the second packaged semiconductor device 170, e.g., over the vertically stacked semiconductor devices 130b and 130c, over the wire bonds 176b and 176c, and over exposed portions of the substrate 172. In other embodiments, a molding material 178 is not included in the PoP device 180. In some embodiments, an underfill material 182 comprising an insulating material is disposed between the first packaged semiconductor device 100 and the second packaged semiconductor device 170. In other embodiments, an underfill material 182 is not included in the PoP device 180.

In some embodiments, semiconductor device 130a comprises a logic device, and semiconductor devices 130b and 130c comprise memory devices, such as dynamic random access memory (DRAM) devices. Alternatively, semiconductor devices 130a, 130b, and 130c may comprise other types of devices and integrated circuits.

Figure 26:
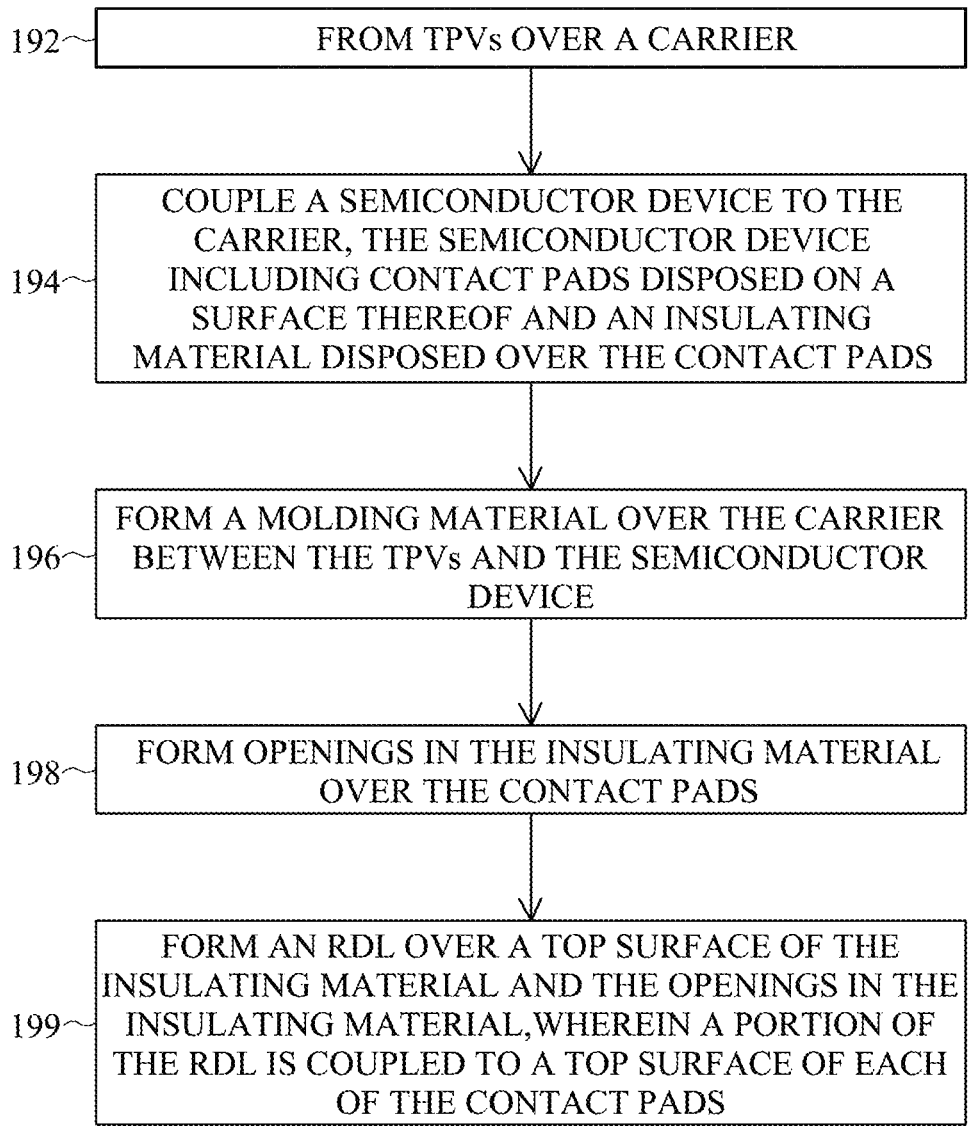
FIG. 26 is a flow chart of a method of packaging a semiconductor device in accordance with some embodiments.

FIG. 26 is a flow chart 190 of a method of packaging a semiconductor device 130 in accordance with some embodiments. In step 192, TPVs 112 are formed over a carrier 150 (see also FIGS. 11 through 15), and in step 194, a semiconductor device 130 is coupled to the carrier 150 (see FIG. 16). The semiconductor device 130 includes contact pads 104 disposed on a surface thereof and an insulating material 106/108 disposed over the contact pads 104 (see FIG. 1). In step 196, a molding material 114 is formed over the carrier 150 between the TPVs 112 and the semiconductor device 130 (see FIGS. 17 and 18). In step 198, openings 131 are formed in the insulating material 106/108 over the contact pads 104 (see FIG. 18). The openings 131 are formed in insulating material 106/108 using a laser drilling process in accordance with some embodiments. In step 199, a redistribution layer (RDL) 120 is formed over the insulating material 106/108 and the openings 131 in the insulating material 106/108 (see FIG. 19). A portion of the RDL 120 is coupled to a top surface of each of the contact pads 104 (see FIG. 1).

Some embodiments of the present disclosure include methods of packaging semiconductor devices 130. Other embodiments include packaged semiconductor devices 100 that have been packaged using the novel methods described herein. Some embodiments of the present disclosure include PoP devices 180 that include the packaged semiconductor devices 100 that have been packaged using the novel methods described herein with reference to FIG. 25.

Advantages of some embodiments of the disclosure include providing novel packaging methods for semiconductor devices. Illustrative embodiments described herein provide novel low-cost methods of forming 3DIC through-package via (TPV) interconnect structures. Packaging devices are provided that have thin polymer layers within a redistribution layer (RDL), which are advantageous in that die warpage, die tilt, and over-grinding are prevented or reduced. Passivation of the thin polymer layers (e.g., such as polymer layer 108) is not included or required in the process flows in some embodiments. The thinness of the polymer layers provides the ability to control die warpage in some applications. The polymer layers are more uniform than thicker polymer layers often used in packaging devices. The novel packaging devices and methods are particularly advantageous when they are used to package thin integrated circuit dies having a thickness of less than about 40 μm, for example.

In some embodiments, a via metal (e.g., first portion 122a of the RDL 120) on an integrated circuit die or semiconductor device 130 is formed by laser drilling. Conductive bumps are not formed on the die; rather, a portion of the RDL 120 is used to make electrical contact to contact pads 104 on the integrated circuit die in some embodiments. An RDL bottom height is about equal to or less than a grinded molding material top height in some embodiments. The thin polymer layer has a continuous profile and opening from passivation. The laser-drilled thin polymer layer has a more rough profile than if the thin polymer layer were patterned using photolithography. An opening in the polymer layer over a contact pad has a width that is less than or about equal to an opening in a passivation layer over the contact pad in some embodiments, wherein the passivation layer is disposed beneath the thin polymer layer.

Breakage or electrical opens of RDLs are reduced or eliminated by forming the via portions 123a within a polymer layer 108 that is part of a portion 122a of the RDL 120, advantageously, which increases yields and reduces costs. Forming the openings 131 in the polymer layer 108 by laser drilling avoids surface wetting sensitivities of polymer materials used for the polymer layer 108 and also the molding material 114, in some embodiments. Furthermore, the novel packaging methods, structures and designs are easily implementable in manufacturing and packaging process flows. Other advantageous features will be apparent to those skilled in the art when informed by the present disclosure.

In accordance with some embodiments of the present disclosure, a method of packaging a semiconductor device includes forming a plurality of TPVs over a carrier, and coupling a semiconductor device to the carrier. The semiconductor device includes a plurality of contact pads disposed on a surface thereof and an insulating material disposed over the plurality of contact pads. The method includes forming a molding material over the carrier between the plurality of TPVs and the semiconductor device, and forming a plurality of openings in the insulating material using a laser drilling process, each of the plurality of openings being disposed over one of the plurality of contact pads. The method includes forming an RDL over the insulating material and the plurality of openings in the insulating material, wherein a portion of the RDL is coupled to a top surface of each of the plurality of contact pads.

In accordance with other embodiments, a method of packaging a semiconductor device includes forming a plurality of TPVs over a carrier, and coupling a plurality of integrated circuit dies to the carrier. Each of the plurality of integrated circuit dies includes a plurality of contact pads, a passivation layer disposed over a portion of the plurality of contact pads, and a polymer layer disposed over the passivation layer. A molding material is formed over the carrier, the plurality of TPVs, and the plurality of integrated circuit dies, and the molding material is removed from over a top surface of the polymer layer of the plurality of integrated circuit dies. The method includes forming an opening in the polymer layer of the plurality of integrated circuit dies over each of the plurality of contact pads using a laser drilling process, and forming an RDL over the top surface of the polymer layer and the plurality of openings in the polymer layer. A portion of the RDL is coupled to a top surface of each of the plurality of contact pads. The method includes removing the carrier and singulating the plurality of integrated circuit dies to form a plurality of packaged semiconductor devices.

In accordance with other embodiments, a packaged semiconductor device includes an integrated circuit die including a first side and a second side opposite the first side, and a plurality of contact pads disposed on the first side of the integrated circuit die. A passivation layer is disposed over the first side of the integrated circuit die, the passivation layer including an opening over each of the plurality of contact pads. A polymer layer is disposed over the passivation layer, the polymer layer including a laser drilled opening over each of the plurality of contact pads. A molding material is disposed around the integrated circuit die, the passivation layer, and the polymer layer, wherein a surface of the molding material is substantially co-planar with a surface of the polymer layer. A plurality of TPVs is disposed within the molding material, and an RDL is disposed over the molding material, the plurality of TPVs, and the polymer layer. The RDL includes wiring that is coupled to each of the plurality of contact pads through the laser drilled openings in the polymer layer and the openings in the passivation layer. An insulating material is disposed over the second side of the integrated circuit die and the molding material, wherein the insulating material includes an opening over each of the plurality of TPVs.

In yet another embodiment, a semiconductor device is provided. The semiconductor device includes an integrated circuit die including a first side and a second side opposite the first side, a contact pad disposed on the first side of the integrated circuit die, a passivation layer disposed over the first side of the integrated circuit die, the passivation layer including a first opening in the passivation layer over the contact pad, a polymer layer disposed over the passivation layer, the polymer layer including a second opening in the polymer layer over the contact pad, a molding material disposed around the integrated circuit die, the passivation layer, and the polymer layer, wherein an upper surface of the molding material is level with an upper surface of the polymer layer, and a redistribution layer (RDL) disposed over the molding material and the polymer layer, wherein a conductive portion of the RDL extends through the second opening in the polymer layer and through the first opening in the passivation layer to contact the contact pad.

In yet another embodiment, a semiconductor device is provided. The semiconductor device includes a first conductive feature disposed on a first side of an integrated circuit die, a first dielectric layer disposed over and directly contacting the first conductive feature and the first side of the integrated circuit die, wherein the first dielectric layer comprises a first opening and exposing the first conductive feature, a second dielectric layer disposed over and directly contacting the first dielectric layer, wherein the second dielectric layer comprises a second opening over the first opening and exposing the first conductive feature, an encapsulant disposed around the first conductive feature, the first dielectric layer, and the second dielectric layer, wherein a top surface of the encapsulant does not extend past a top surface of the second dielectric layer, and a third dielectric layer disposed over and directly contacting the second dielectric layer and the encapsulant, the third dielectric layer comprising at least one second conductive feature, wherein one of the at least one second conductive features extends through the first opening and the second opening to contact the first conductive feature and contacts the second dielectric layer.

In yet another embodiment, a semiconductor device is provided. The semiconductor device includes a first packaged semiconductor device having an integrated circuit die, a conductive pad disposed on a top surface of the integrated circuit die, a passivation layer disposed on the top surface of the integrated circuit die, the passivation layer including an opening in the passivation layer over the conductive pad, wherein the opening in the passivation layer comprises a sidewall, a polymer layer disposed on the passivation layer, the polymer layer including an opening in the polymer layer over the conductive pad, wherein the opening in the polymer layer comprises a sidewall, a molding material disposed around the integrated circuit die, the passivation layer, and the polymer layer, a redistribution layer (RDL) disposed over the molding material and the polymer layer, wherein a conductive surface of the RDL contacts the polymer layer and the conductive pad of the integrated circuit die, and a plurality of through-package vias (TPVs) disposed within the molding material. The semiconductor device further includes a second packaged semiconductor device electrically coupled to a first end of each of the plurality of TPVs.

In accordance with some embodiments of the present disclosure, a packaged semiconductor device includes a substrate and a contact pad disposed on the semiconductor substrate. The packaged semiconductor device also includes a dielectric layer disposed over the contact pad, the dielectric layer including a first opening over the contact pad, and an insulator layer disposed over the dielectric layer, the insulator layer including a second opening over the contact pad. The packaged semiconductor device also includes a molding material disposed around the substrate, the dielectric layer, and the insulator layer and a wiring over the insulator layer and extending through the second opening, the wiring being electrically coupled to the contact pad.

In accordance with other embodiments, a packaged semiconductor device includes a semiconductor device. The semiconductor device includes a contact pad, a passivation layer disposed over contact pad, the passivation layer including a first opening over the contact pad, and a polymer layer disposed over the passivation layer, the polymer layer including a second opening over the contact pad and aligned with the first opening. The packaged semiconductor device also includes a molding material disposed along sidewalls of the semiconductor device and a wiring over the polymer layer, the wiring extending through the second opening and the first opening, the wiring being electrically coupled to the contact pad.

In accordance with other embodiments, a package-on-package device includes a first packaged device. The first packaged device includes a semiconductor substrate, a contact pad disposed on the semiconductor substrate, a passivation layer disposed over the contact pad, the passivation layer including a first opening over the contact pad, and a polymer layer disposed over the passivation layer, the polymer layer including a second opening over the contact pad. The first packaged device also includes a molding material disposed along sidewalls of around the semiconductor substrate, the passivation layer, and the polymer, a through via disposed within the molding material, and a wiring over the polymer layer, the wiring extending through the second opening and being electrically connected to the contact pad. The package-on-package device also includes a second packaged device electrically coupled to the through via.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a semiconductor device including:
        a contact pad;
        a passivation layer disposed over the contact pad; and
        a polymer layer disposed over the passivation layer;
    a molding material disposed along sidewalls of the semiconductor device; and
    a wiring over the polymer layer, the wiring extending through the polymer layer having a jagged sidewall, the wiring being electrically coupled to the contact pad.

2. The semiconductor device of claim 1, wherein the wiring contacts the passivation layer and the polymer layer.

3. The semiconductor device of claim 1, wherein the wiring contacts an upper surface of the polymer layer.

4. The semiconductor device of claim 1 further comprising an insulator layer over the wiring, wherein the insulator layer extends lower than an upper surface of the polymer layer.

5. The semiconductor device of claim 4, wherein the insulator layer extends along a sidewall of the wiring.

6. The semiconductor device of claim 1 further comprising a through via in the molding material.

7. The semiconductor device of claim 6, wherein the through via extends completely through the molding material.

8. A package-on-package (PoP) device, comprising:
    a first package device comprising:
        a semiconductor device, the semiconductor device comprising:
            a contact pad;
            a passivation layer disposed over the contact pad; and
            a polymer layer disposed over the passivation layer;
        a molding material disposed along sidewalls of the semiconductor device; and
        a wiring over the polymer layer, the wiring extending through the polymer layer having a jagged sidewall, the wiring being electrically coupled to the contact pad; and
    a second package device electrically coupled to the first package device.

9. The PoP device of claim 8, wherein the second package device comprises stacked semiconductor devices.

10. The PoP device of claim 9, wherein the stacked semiconductor devices are wire bonded to an interposer.

11. The PoP device of claim 8 further comprising a conductive bump between the first package device and the second package device.

12. The PoP device of claim 11, wherein the conductive bump comprises solder.

13. The PoP device of claim 8, wherein the wiring contacts the passivation layer and the polymer layer.

14. The PoP device of claim 8, wherein the molding material extends along sidewalls of the polymer layer.

15. A semiconductor structure comprising:
    a semiconductor device comprising a contact pad, a first dielectric layer disposed over the contact pad, and a second dielectric layer disposed over the first dielectric layer;
    a molding material disposed along sidewalls of the semiconductor device, the first dielectric layer, and the second dielectric layer; and
    a wiring over the second dielectric layer and the molding material, the wiring extending through the second dielectric layer to the contact pad, the second dielectric layer having a jagged sidewall extending from the contact pad to an upper surface of the second dielectric layer.

16. The semiconductor structure of claim 15 further comprising a package over the wiring, the wiring electrically coupling the semiconductor device to the package.

17. The semiconductor structure of claim 16, wherein the package comprises a first semiconductor die wire bonded to an interposer.

18. The semiconductor structure of claim 17, wherein the package comprises a second semiconductor die wire bonded to the interposer.

19. The semiconductor structure of claim 15 further comprising a third dielectric layer over the wiring, wherein the third dielectric layer extends lower than an upper surface of the second dielectric layer.

20. The semiconductor structure of claim 15, wherein the wiring contacts the first dielectric layer and the second dielectric layer.

* * * * *